United States Patent
Maeda et al.

(10) Patent No.: US 8,040,192 B2
(45) Date of Patent: Oct. 18, 2011

(54) POWER SUPPLY VOLTAGE OUTPUT CIRCUIT

(75) Inventors: Masazumi Maeda, Kawasaki (JP); Yoshito Koyama, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 12/607,964

(22) Filed: Oct. 28, 2009

(65) Prior Publication Data

US 2010/0109786 A1    May 6, 2010

(30) Foreign Application Priority Data

Oct. 31, 2008   (JP) ................ 2008-281910

(51) Int. Cl.
*H03L 1/00*   (2006.01)
*H03L 3/00*   (2006.01)
*H03L 7/00*   (2006.01)
(52) U.S. Cl. ............ 331/17; 331/34; 331/57; 331/186
(58) Field of Classification Search ............ 331/17, 331/18, 25, 34, 57, 185, 186; 363/21.1, 41
See application file for complete search history.

(56) References Cited

U.S. PATENT DOCUMENTS

| 6,157,231 A | 12/2000 | Wasson |
| 2002/0190283 A1 | 12/2002 | Seno et al. |
| 2005/0001600 A1* | 1/2005 | Morales ............ 323/282 |
| 2006/0139820 A1 | 6/2006 | Ozawa et al. |

FOREIGN PATENT DOCUMENTS

| JP | 2002-100967 A | 4/2002 |
| JP | 2002-540668 A | 11/2002 |
| JP | 2006-187153 A | 7/2006 |

* cited by examiner

Primary Examiner — David Mis
(74) Attorney, Agent, or Firm — Fujitsu Patent Center

(57) ABSTRACT

A power supply voltage output circuit includes: a power supply voltage generation unit generating a power supply voltage to be supplied into a ring oscillator; a reference clock oscillator oscillating a reference clock with respect to a clock oscillated by the ring oscillator; a phase difference detection unit detecting a phase difference between the clock from the ring oscillator and the reference clock from the reference clock oscillator; a filter unit smoothing an output of the phase difference detection unit; and a PWM signal generation unit generating a PWM signal based on an output of the filter unit such that the phase difference approaches zero.

5 Claims, 5 Drawing Sheets

POWER SUPPLY VOLTAGE OUTPUT CIRCUIT

CROSS-REFERENCE TO RELATED APPLICATION

This application is based upon and claims the benefit of priority of the prior Japanese Patent Application No. 2008-281910, filed on Oct. 31, 2008, the entire contents of which are incorporated herein by reference.

FIELD

The present invention relates to a power supply voltage output circuit which supplies a drive voltage to a ring oscillator.

BACKGROUND

An oscillation frequency of a ring oscillator depends on changes of ambient temperatures and power supply voltages.

Due to this, techniques for achieving a constant oscillation frequency of the ring oscillator have been proposed. For example, a delay time of a delay element in the ring oscillator is controlled by controlling a power supply voltage supplied to a ring oscillator, which may result in constant oscillation frequency.

Japanese Patent Application Publication No. 2002-540668, for example, discloses a system which is provided with an oscillator, a delay circuit, and a loop controller. The system keeps a delay in a signal path in an integrated circuit (IC) constant. In the system, the oscillator generates a first reference signal. The delay circuit generates a second reference signal by delaying the first reference signal. The loop controller keeps a phase difference between the first reference signal and the second reference signal constant by adjusting electric power supplied to the IC.

The oscillator in the system includes a logic gate formed in the IC and a passive delay by which an output of the logic gate is fed back to an input. The delay circuit is adjusted to program the delay in the signal path through the IC.

However, the delay circuit that is programmably configured is not equivalent, in a precise sense, to a logic circuit because an output of the delay circuit varies. Moreover, according to a control method where a direct current signal is extracted from the phase difference by using a low-pass filter and where the direct current signal is converted into voltage by using a power amplifier, whereby the power supply voltage is fed back, the control accuracy of the power supply voltage has limitations because a fluctuation of the loop controller itself is not taken into consideration.

Japanese Patent Laid-open Publication No. 2006-187153 discloses a system which compares an oscillation signal output from a ring oscillator formed on a semiconductor integrated circuit with a triangular wave signal output from an oscillator provided in a DC-DC converter. The system changes the output voltage by changing a comparison voltage which is used for a comparison with an output voltage, based on a result of the comparison.

In the system, the semiconductor integrated circuit achieves a rate of operation corresponding to that of the triangular wave signal by matching the oscillation signal of the ring oscillator with the triangular wave signal which serves as a reference signal.

However, because a phase comparator and a loop filter are formed of analog circuits, the control accuracy of the power supply voltage has limitations. Moreover, a lack of versatility may be a problem because it is not easy to change operating conditions of the phase comparator and/or the loop filter when the phase comparator and/or the loop filter are used for a different controlled target with respect to a controlled target intended at a design stage.

Japanese Patent Laid-open Publication No. 2002-100967 discloses a system which is provided with a semiconductor integrated circuit, an input signal generation circuit, a monitor circuit, a delay detection circuit, and a power supply voltage control circuit. The input signal generation circuit changes a phase difference between a reference signal and an input signal in response to a control signal upon generation of the reference signal and the input signal from a clock signal. The monitor circuit has a power supply voltage versus delay characteristic which has an equivalent or similar value to a critical path of the semiconductor integrated circuit, and the monitor circuit propagates the input signal and outputs a delay signal that is delayed by a time equivalent or similar to the critical path. The delay detection circuit detects a delay in the delay signal relative to the reference signal. The power supply voltage control circuit controls power supply voltage supplied to the semiconductor integrated circuit and the monitor circuit based on a result of the detection.

Generally, a variation in the delay time of the delay element is not only caused by the variation in the power supply voltage but also caused by variations in the manufacturing processes, the environmental temperatures, or the like.

However, because the monitor circuit of a controlled target is disposed outside the semiconductor integrated circuit, the variation in the processes at manufacturing stages and the variation in the environmental temperatures when in use may influence the delay time of the delay element.

In line with a recent semiconductor manufacturing process, an accuracy demand for a delay time control of a delay element in a ring oscillator has been growing. Likewise, an accuracy demand for a power supply voltage control has been also growing.

SUMMARY

One embodiment of the invention provides a power supply voltage output circuit including: a power supply voltage generation unit generating a power supply voltage to be supplied into a ring oscillator; a reference clock oscillator oscillating a reference clock with respect to a clock oscillated by the ring oscillator; a phase difference detection unit detecting a phase difference between the clock from the ring oscillator and the reference clock from the reference clock oscillator; a filter unit smoothing an output of the phase difference detection unit; and a PWM signal generation unit generating a PWM signal based on an output of the filter unit such that the phase difference becomes substantially zero.

It is to be understood that both the foregoing general description and the following detailed description are exemplary, and are not restricted to the invention, as claimed.

BRIEF DESCRIPTION OF DRAWINGS

The above and other objects, features and advantages of the present invention will become apparent from the following description of the embodiments in conjunction with the accompanying drawings, wherein.

DESCRIPTION OF EMBODIMENTS

Embodiments of the present invention will be described hereinafter with reference to the accompanying drawings.

Figure 1:
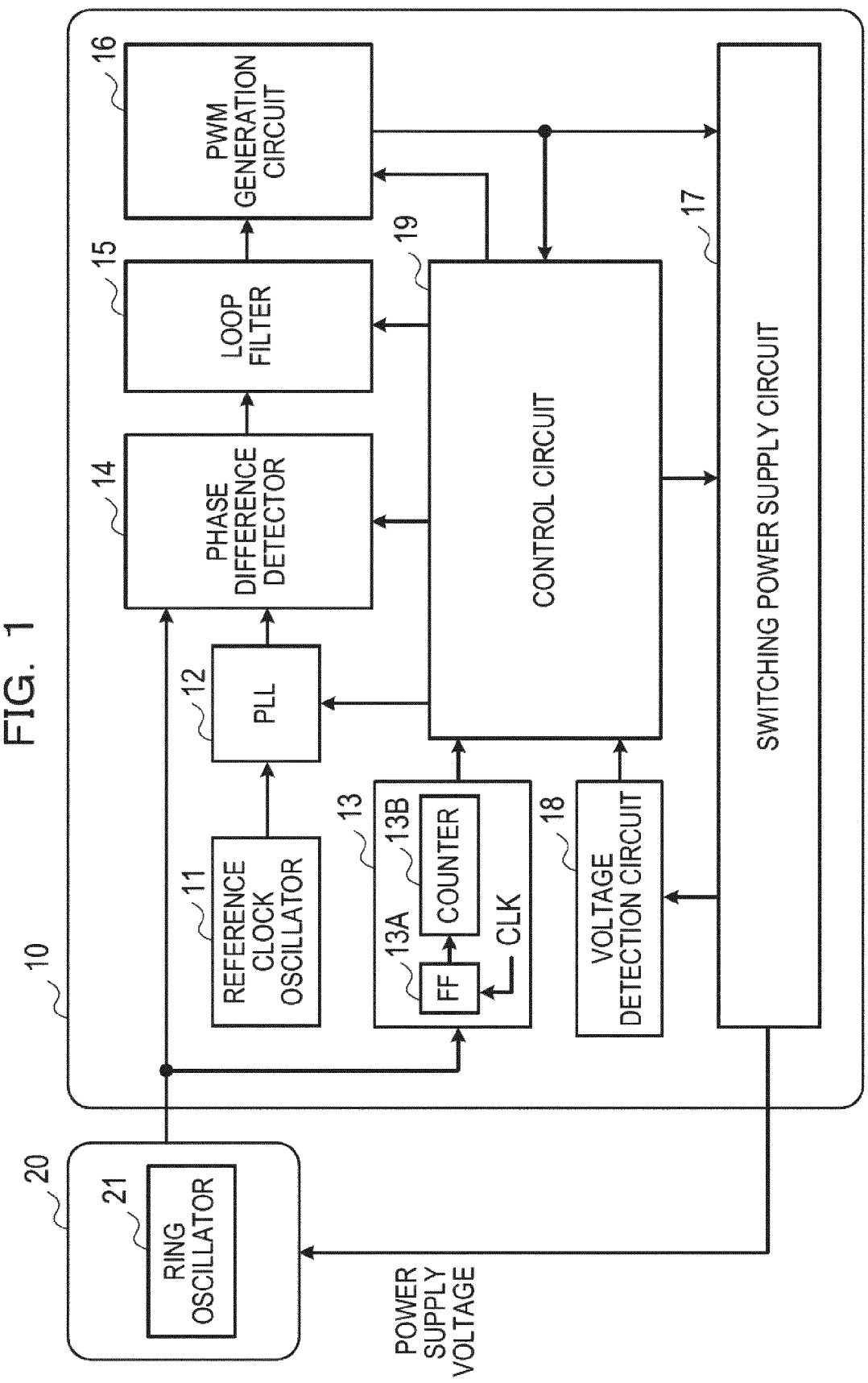
FIG. 1 is a diagram of a power supply voltage output circuit according to a first embodiment of the invention.

FIG. 1 is a diagram of the power supply voltage output circuit according to a first embodiment.

A semiconductor integrated circuit includes a power supply voltage output circuit 10 and a ring oscillator 21 in a control target 20.

The power supply voltage output circuit 10 includes a reference clock oscillator 11, a Phase Locked Loop (PLL) 12, an oscillation state detector 13, a phase difference detector 14, a loop filter 15, a Pulse Width Modulation (PWM) generation circuit 16, a switching power supply circuit 17, a voltage detection circuit 18, and a control circuit 19.

Certainly, the oscillation state detector 13, the phase difference detector 14, the loop filter 15, the PWM generation circuit 16, the voltage detection circuit 18, and the control circuit 19 are formed of digital circuits. On the other hand, the switching power supply circuit 17 is formed of a digital circuit and a plurality of transistors.

The reference clock oscillator 11 oscillates a reference clock. The reference clock oscillator 11 is formed of a high-accuracy oscillator such as a Temperature Compensated Xtal Oscillator (TCXO), an Oven Controlled Xtal Oscillator (OCXO), or the like. The reference clock oscillated by the reference clock oscillator 11 is input into the PLL 12.

The PLL 12 has a loop for comparing a phase difference between an input signal and an output signal. The PLL is a circuit that generates an output signal having a frequency which is synchronized with the input signal by using a divider. The PLL 12 generates an output signal having a frequency which is synchronized with the reference clock input from the reference clock oscillator 11, based on a setting of an internal divider.

The oscillation state detector 13 detects an oscillation state (i.e., an operating state) of the ring oscillator 21 based on a clock input from the power supply voltage output circuit 10 from the ring oscillator 21. The oscillation state detector 13 is a digital circuit and includes a flip-flop (FF) 13A and a counter 13B. A clock (CLK) having a known oscillation frequency is input into the flip-flop 13A. The flip-flop 13A may detect whether the ring oscillator 21 is oscillating or not by sampling the clock of the ring oscillator 21 input into the power supply voltage output circuit 10. The oscillation state detector 13 may be regarded as an operating state detection unit of the invention.

The phase difference detector 14 compares an oscillation frequency of the clock input from the ring oscillator 21 to an oscillation frequency of a clock input from the PLL 12, and detects a phase difference between the clocks. The phase difference detector 14 is formed of, for example a logic circuit such as a flip-flop. The phase difference detector 14 may be regarded as a phase difference detection unit of the invention.

The loop filter 15 smoothes a signal indicating the phase difference which is input from the phase difference detector 14. The loop filter 15 is formed of, for example, a digital filter such as a Finite Impulse Response (FIR) filter or an Infinite Impulse Response (IIR) filter. The loop filter 15 outputs a voltage value corresponding to the phase difference input from the phase difference detector 14. The voltage value is input into the PWM generation circuit 16. The loop filter 15 may be regarded as a filter unit of the invention.

The PWM generation circuit 16 is formed of a digital circuit. The PWM generation circuit 16 generates a Pulse Width Modulation signal having a pulse width corresponding to the voltage value input from the loop filter 15. The PWM signal output from the PWM generation circuit 16 is input into the switching power supply circuit 17. The PWM generation circuit 16 may be regarded as a Pulse Width Modulation signal generation unit of the invention.

The switching power supply circuit 17 generates a voltage corresponding to the PWM signal input from the PWM generation circuit 16. An output of the switching power supply circuit 17 serves as a power supply voltage, and is supplied into the ring oscillator 21. The switching power supply circuit 17 may be regarded as a power supply voltage generation unit of the invention.

The switching power supply circuit 17 is formed of, for example, a P-channel Metal Oxide Semiconductor Field-Effect Transistor (MOSFET) and an N-channel MOSFET. The P-channel MOSFET and the N-channel MOSFET may be switched ON/OFF in a complementary manner. Drains of the P-channel MOSFET and the N-channel MOSFET are connected to each other. An input voltage is applied to a source of the P-channel MOSFET. A source of the N-channel MOSFET is grounded. The PWM signal is applied to gates of the P-channel MOSFET and the N-channel MOSFET so that a voltage corresponding to a duty ratio of the PWM signal is output as the power supply voltage for the ring oscillator 21 from an interconnection point of the drains.

The voltage detection circuit 18 detects the power supply voltage output from the switching power supply circuit 17. The voltage detection circuit 18 is formed of, for example, an Analog-Digital Converter (ADC). The ADC, which is a digital circuit, detects a power supply voltage output from the voltage detection circuit 18, converts the power supply voltage into a digital voltage value, and outputs the digital voltage value. The voltage detection circuit 18 may be regarded as a power supply voltage detection unit of the invention.

The control circuit 19 is a digital circuit formed of, for example, a logic circuit. The control circuit 19 sets or controls the PLL 12, the oscillation state detector 13, the phase difference detector 14, the loop filter 15, the PWM generation circuit 16, the switching power supply circuit 17, and the voltage detection circuit 18. The control circuit 19 may include a Central Processing Unit (CPU) for setting or controlling over the above-described circuit members.

The control circuit 19 adjusts a cut-off frequency of the loop filter 15 and/or adjusts a voltage threshold value used for generating the PWM signal in the PWM signal generation circuit 16. The control circuit 19 may be regarded as a first control unit of the invention.

The control circuit 19 adjusts at least one of an output of the phase difference detector 14, an output of the loop filter 15, or an output of the PWM signal generation circuit 16, or any combination thereof to a certain output so that the power supply voltage at a certain voltage value may be output from the switching power supply circuit 17 within a certain period of time after the ring oscillator 21 is activated. The control circuit 19 may be also regarded as a second control unit of the invention.

The control circuit 19 switches the switching power supply circuit 17 to an abnormal drive mode (e.g., a drive OFF mode) when it is determined that a voltage value detected by the voltage detection circuit 18 is not within a certain range. The control circuit 19 may be also regarded as a third control unit of the invention.

Likewise, the control circuit 19 switches the switching power supply circuit 17 to the abnormal drive mode (e.g., the drive OFF mode) when it is determined that any abnormality is found in an operating state of the ring oscillator 21 which is detected by the oscillation state detector 13. The control circuit 19 may be also regarded as a fourth control unit of the invention.

More detail about the control circuit 19 will be described below.

Figure 2:
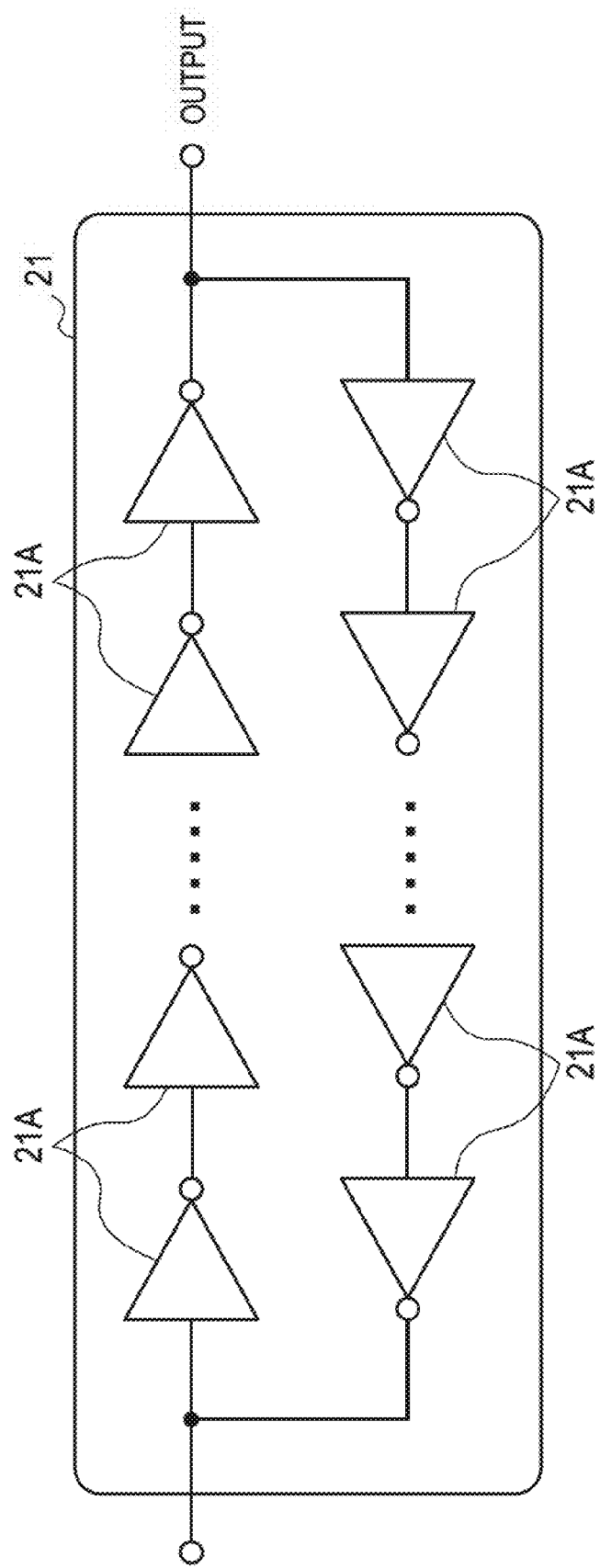
FIG. 2 is a diagram of a ring oscillator to which power supply voltage is supplied by the power supply voltage output circuit according to the first embodiment.

FIG. 2 is a diagram of the ring oscillator 21 to which the power supply voltage is supplied from the power supply voltage output circuit according to the first embodiment.

The ring oscillator 21 has an odd number of inverter stages. In the power supply voltage output circuit according to the first embodiment, the ring oscillator 21 has a plurality of inverter (INV) circuits 21A.

The power supply voltage is supplied into respective INV circuits 21A from the power supply voltage output circuit 10. The power supply voltage is a voltage value corresponding to the phase difference, which is detected by the phase difference detector 14, between the clock which is input from the ring oscillator 21 and the clock which is input from the PLL 12. Thus, a delay time of respective INV circuits 21A is adjusted by the power supply voltage. Accordingly, an oscillation frequency of the ring oscillator 21 is controlled such that the phase difference detected by the phase difference detector 14 substantially becomes zero.

Operation of the power supply voltage output circuit 10 according to the first embodiment will be described below.

The phase difference between the clock input from the ring oscillator 21 and the clock input from the PLL 12 is detected by the phase difference detector 14. Then, a signal indicating the phase difference is input into the loop filter 15, and a voltage value corresponding to the phase difference is output from the loop filter 15. The PWM generation circuit 16 outputs the PWM signal having the pulse width corresponding to the voltage value input from the loop filter 15. The PWM signal is input into the switching power supply circuit 17, and the P-channel MOSFET and the N-channel MOSFET in the switching power supply circuit 17 are switched ON/OFF in a complementary manner, so that the power supply voltage is generated, accordingly.

The power supply voltage generated by the switching power supply circuit 17 is supplied into the ring oscillator 21. Consequently, the delay time of respective inverters (i.e., delay elements) in the ring oscillator 21 is adjusted, and feed-back control is performed such that the oscillation frequency of the ring oscillator 21 matches an oscillation frequency of the reference clock oscillator 11 (that is, such that the phase difference detected by the phase difference detector 14 becomes substantially zero).

Since the oscillation state detector 13, the phase difference detector 14, the loop filter 15, the PWM generation circuit 16, a part of the switching power supply circuit 17, the voltage detection circuit 18, and the control circuit 19 are digital circuits in the power supply voltage output circuit 10 according to the first embodiment, the power supply voltage may be adjusted with high accuracy in comparison to a case where the above circuit members are formed of analog circuits.

Next, the setting and processing to handle abnormalities carried out in the control circuit 19 are described below.

The control circuit 19 sets a frequency dividing ratio of the PLL 12. The frequency dividing ratio of the PLL 12 may be set in response to the oscillating frequencies of the reference clock oscillator 11 and the ring oscillator 21 through the control circuit 19. The frequency dividing ratio of the PLL 12 may be set through the control circuit 19 of the digital circuit with ease.

The power supply voltage may be stably supplied into the ring oscillator if a user changes the frequency dividing ratio of the PLL 12 through the control circuit 19 although the reference clock oscillator 11 and the ring oscillator 21 are replaced with ones having different oscillation frequencies.

As described above, according to the power supply voltage output circuit 10 of the first embodiment, since the frequency dividing ratio may be changed, the power supply voltage output circuit 10 has versatility with respect to various reference clock oscillators and ring oscillators having different oscillating frequencies.

A process is performed by the control circuit 19 based on the oscillation status of the ring oscillator 21 which is detected by the oscillation state detector 13. For example, the control circuit 19 stops the operation of the switching power supply circuit 17. A user may set the process to handle an abnormality through the control circuit 19 of the digital circuit.

The operation stop of the switching power supply circuit 17 may be achieved by blocking a voltage supply to the switching power supply circuit 17. Alternatively, the switching power supply circuit 17 may also be stopped by restricting or blocking the output of the phase difference detector 14, the output of the loop filter 15, or the output of the PWM generation circuit 16 such that the output voltage of the switching power supply circuit 17 becomes substantially zero.

In the power supply voltage output circuit 10 according to the first embodiment, since the phase difference detector 14, the loop filter 15, the PWM generation circuit 16, a part of the switching power supply circuit 17, and the control circuit 19 are formed of the digital circuits, the user may control the operation state of the switching power supply circuit 17 through the control circuit 19 with ease.

The control circuit 19 controls the output of the phase difference detector 14. For example, the control circuit 19 holds the output value of the phase difference detector 14 at a certain value for a certain period of time after the ring oscillator 21 is activated.

The phase difference detected by the phase difference detector 14 may be relatively greater due to an unstable oscillation frequency of the ring oscillator 21 immediately after activating the ring oscillator 21. In the above case, it is assumed that a variation in the voltage output from the switching power supply circuit 17 becomes relatively greater. For this reason, the configuration described below is preferable. That is, the output of the phase difference detector 14 is held for a period until the phase difference falls within a certain range. After the phase difference falls within the certain range, the control circuit 19 stops holding the output of the phase difference detector 14.

Since the phase difference detector 14 and the control circuit 19 are formed of the digital circuits, a user may control the output of the phase difference detector 14 with ease.

The control circuit 19 also sets a cut-off frequency of the loop filter 15. If a loop filter is formed of an analog circuit, the capacitance value of a capacitor or a resistance value of a resistor may be preferably changed in order to change the cut-off frequency of the analog loop filter. However, since the loop filter 15 is formed of the digital circuit, the cut-off frequency may be changed with ease through the control circuit 19 by changing a parameter of the FIR filter or the IIR filter which forms the loop filter 15.

Consequently, even if the reference clock oscillator 11 and the ring oscillator 21 are replaced with oscillators having different oscillation frequencies, the power supply voltage output circuit 10 may comply with the replacement with ease by changing a parameter of the FIR filter or the IIR filter.

Moreover, even if the oscillation of the ring oscillator 21 is not detected, the operation stop of the switching power supply circuit 17 may be achieved with ease by changing a parameter of the FIR filter or the IIR filter to block the output of the loop filter 15.

The control circuit 19 also sets an operating condition of the PWM generation circuit 16. For example, the setting may be achieved with ease by changing a frequency of the clock signal input into the PWM generation circuit 16 or by changing the voltage threshold serving as a comparative reference relative to the output of the loop filter 15, through the control circuit 19. Since the PWM generation circuit 16 is the digital circuit, the operating condition of the PWM generation circuit 16 may be changed with ease through the control circuit 19.

Also, even if the oscillation of the ring oscillator 21 is not detected, the operation stop of the switching power supply circuit 17 may be achieved with ease by changing the operating condition of the PWM generation circuit 16 and adjusting the duty ratio of the PWM signal to substantially zero.

According to the power supply voltage output circuit 10 of the first embodiment, the frequency of the clock signal input into the PWM generation circuit 16 and the comparative reference voltage of the PWM generation circuit 16 may be changed by a user through the control circuit 19. Therefore, the PWM signal may be controlled with high-accuracy, and the power supply voltage may be controlled finely and with high-accuracy.

The control circuit 19 also sets an operating condition of the switching power supply circuit 17. For example, a voltage value which is input into the source of the P-channel MOSFET is changed by a user in accordance with a rating or the like of the control target 20, through the control circuit 19.

As described above, when the oscillation of the ring oscillator 21 is not detected, the operation of the switching power supply circuit 17 may be stopped by blocking the voltage supply to the switching power supply circuit 17 or by restricting or blocking the output of the phase difference detector 14, the loop filter 15, or the PWM generation circuit 16. Likewise, the switching power supply circuit 17 may also be stopped by restricting or blocking the output of the phase difference detector 14, the output of the loop filter 15, or the output of the PWM generation circuit 16 such that the output voltage of the switching power supply circuit 17 becomes substantially zero.

The control circuit 19 also carries out a process based on the voltage value detected by the voltage detection circuit 18. For example, when the voltage value which is detected by the voltage detection circuit 18 deviates from a certain voltage range, the control circuit 19 stops the operation of the switching power supply circuit 17. Since the control circuit 19 is the digital circuit, the user may set the process to handle such an abnormality with ease.

As described above, the operation stop of the switching power supply circuit 17 may be achieved by blocking a voltage supply to the switching power supply circuit 17. Alternatively, the switching power supply circuit 17 may also be stopped by restricting or blocking the output of the phase difference detector 14, the output of the loop filter 15, or the output of the PWM generation circuit 16 such that the output voltage of the switching power supply circuit 17 becomes substantially zero.

According to the first embodiment, the switching power supply circuit 17 and the control circuit 19 are formed of the digital circuits. Thus, a user may respond to an abnormality in the operation of the switching power supply circuit 17 with ease by designing the logic circuit of the control circuit 19, or by designing a program which is executed by the CPU if the control circuit 19 includes a CPU.

According to the first embodiment, a user may change (i) the setting of the frequency dividing ratio of the PLL 12, (ii) the setting of the cut-off frequency of the loop filter 15, (iii) the frequency of the clock signal input into the PWM generation circuit 16, and (iv) the comparative reference voltage of the PWM generation circuit 16. Therefore, the power supply voltage output circuit 10 may be optimized in response to variations in the manufacturing processes, the difference in the ambient temperature, or the like. Consequently, the power supply voltage output circuit 10 may supply the power supply voltage into the ring oscillator 21 stably with high-accuracy.

Figure 3:
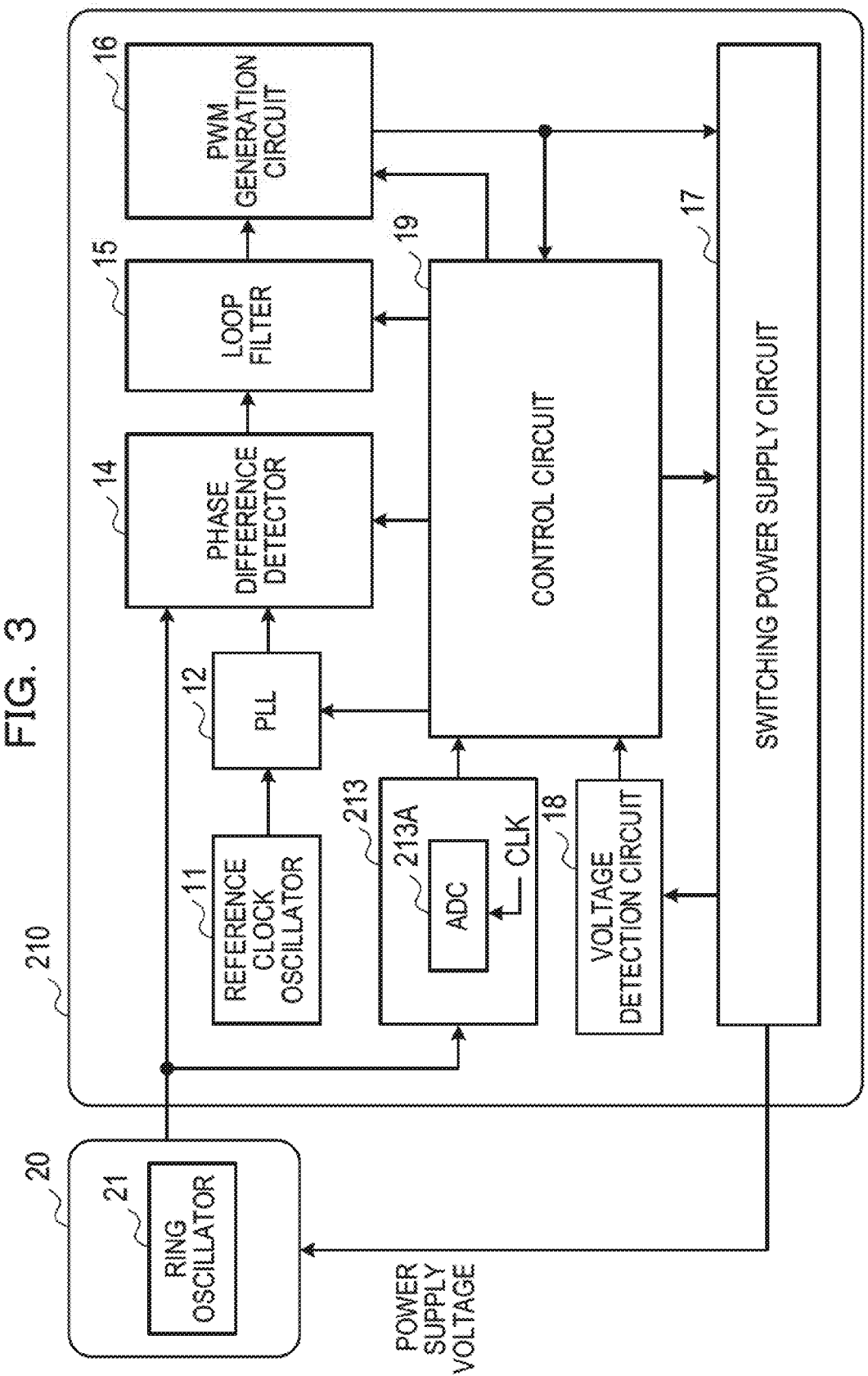
FIG. 3 is a diagram of a power supply voltage output circuit according to a second embodiment of the invention.

FIG. 3 is a diagram of a power supply voltage output circuit according to a second embodiment.

A power supply voltage output circuit 210 according to the second embodiment includes an oscillation state detector 213 having an analog-digital converter (ADC) 213A instead of the oscillation state detector 13 having the FF 13A and the counter 13B of the first embodiment. The other structures thereof are similar to those of the power supply voltage output circuit 10 according to the first embodiment, and the same elements are provided with the same reference symbols. The detailed description thereof will be omitted.

The oscillation state detector 213 having the ADC 213A is formed of a digital circuit. The ADC 213A detects a clock voltage which is output from a ring oscillator 21, converts the detected clock voltage into a digital voltage value, and outputs the digital voltage value.

The FF 13A and the counter 13B according to the first embodiment detect the oscillation status of the ring oscillator 21 (that is, whether the ring oscillator 21 is oscillating or not), by sampling the clock of the ring oscillator 21 input into the power supply voltage output circuit 10. In particular, the oscillation state detector 13 according to the first embodiment may be effective when the oscillation frequency of the ring oscillator 21 is relatively low.

On the other hand, the ADC 213A included in the oscillation frequency detector 213 according to the second embodiment may detect the oscillation status of the ring oscillator 21 even when the oscillation frequency of the ring oscillator 21 is relatively high.

In addition, the oscillation state detector 213, a phase difference detector 14, a loop filter 15, a PWM generation circuit 16, a part of a switching power supply circuit 17, a voltage detection circuit 18, and a control circuit 19 in the power supply voltage output circuit 210 according to the second embodiment are formed of digital circuits.

Consequently, according to the second embodiment, a user may change (i) the setting of the frequency dividing ratio of the PLL 12, (ii) the setting of the cut-off frequency of the loop filter 15, (iii) the frequency of the clock signal input into the PWM generation circuit 16, and (iv) the comparative reference voltage of the PWM generation circuit 16. Therefore, the power supply voltage output circuit 210 may be optimized in response to variations in the manufacturing processes, the difference in the ambient temperature, or the like. The power supply voltage output circuit 210 may supply the power supply voltage into the ring oscillator 21 stably with high-accuracy.

Figure 4:
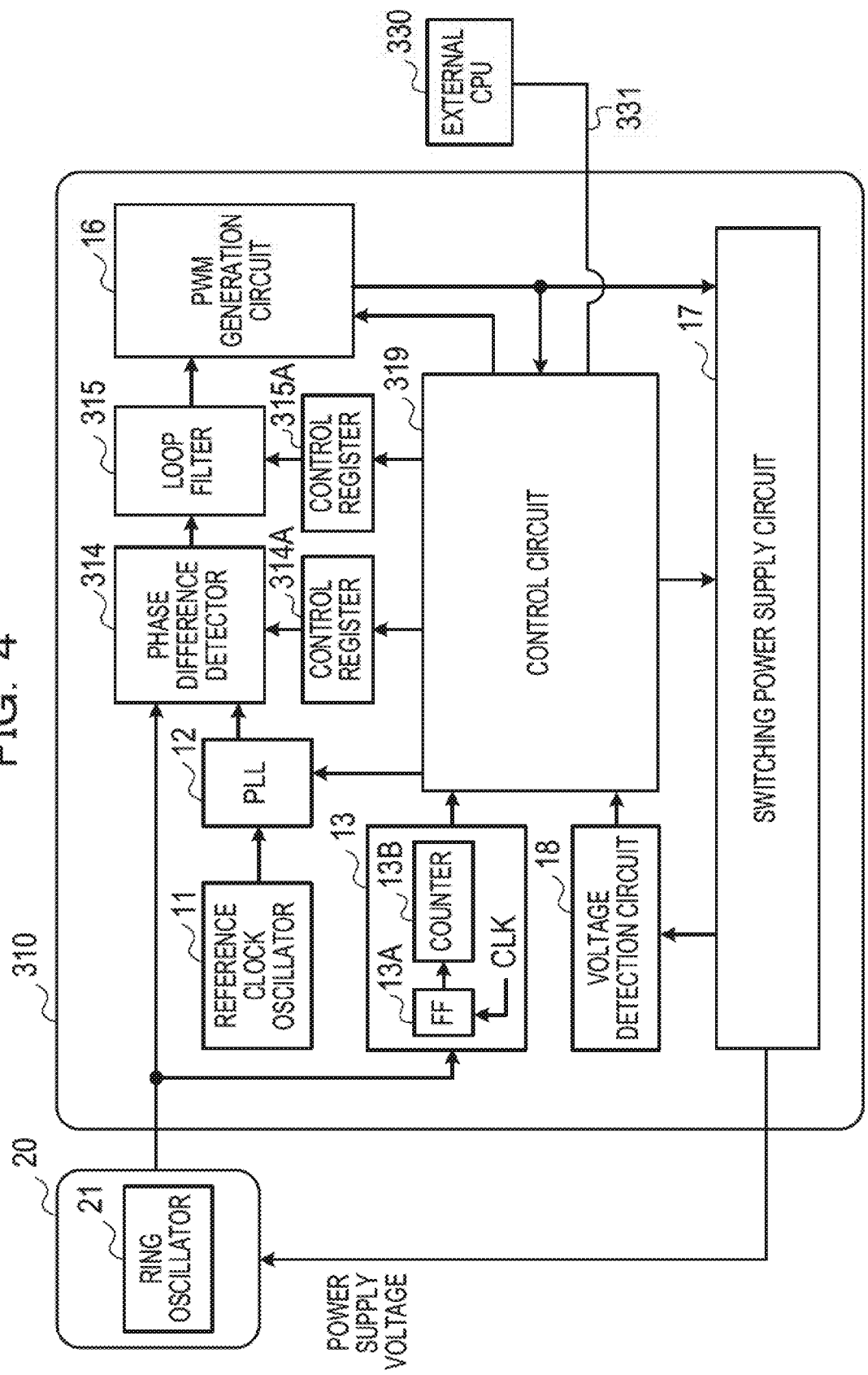
FIG. 4 is a diagram of a power supply voltage output circuit according to a third embodiment of the invention.

FIG. 4 is a diagram of a power supply voltage output circuit according to a third embodiment.

A control circuit 319 of a power supply voltage output circuit 310 according to the third embodiment is configured to have a logic circuit without a CPU. The control circuit 319 changes an output value of a phase difference detector 314 and a cut-off frequency of a loop filter 315 through control registers 314A and 315A, respectively. The control circuit 319 is connected to an external CPU 330.

The other structures thereof are similar to those of the power supply voltage output circuit 10 according to the first embodiment, and the same structural elements are provided with the same reference symbols. The detailed description thereof will be omitted. The phase difference detector 314 and the loop filter 315 are substantially the same as the phase difference detector 14 and the loop filter 15 in the first embodiment.

The external CPU 330 is connected to the control circuit 319 through an external bus 331, and operates the control circuit 319.

The external CPU 330 may be, for example, a CPU included in a conventional personal computer of a user. Thus, the user may operate the control circuit 319 by manipulating the personal computer including the CPU 330.

The control register 314A changes an output value of the phase difference detector 314 in line with a command from the external CPU 330 transferred through the control circuit 319 when an output value is held at a certain value for a certain period of time after activation of the phase difference detector 314 or when an output of the phase difference detector 314 is switched to zero if the oscillation by the ring oscillator 21 is not detected by an oscillation state detector 13.

The control register 315A changes a parameter of the loop filter 315 according to a command from the external CPU 330 transferred through the control circuit 319 when changing the cut-off frequency of the loop filter 315.

According to the third embodiment, the user may change various settings or the like as described above by operating the control circuit 319 through the personal computer including the external CPU 330.

In addition, the oscillation state detector 13, the control register 314A, the phase difference detector 314, the control register 315B, the loop filter 315, a PWM generation circuit 16, a part of the switching power supply circuit 17, the voltage detection circuit 18, and the control circuit 19 in the power supply voltage output circuit 310 according to the third embodiment are formed of digital circuits.

Therefore, the power supply voltage output circuit 310 may be optimized in response to variations in the manufacturing processes, the difference in the ambient temperature, or the like by operating the control circuit 319 through the external CPU 330. The power supply voltage output circuit 310 may supply the power supply voltage into the ring oscillator 21 stably with high-accuracy.

Figure 5:
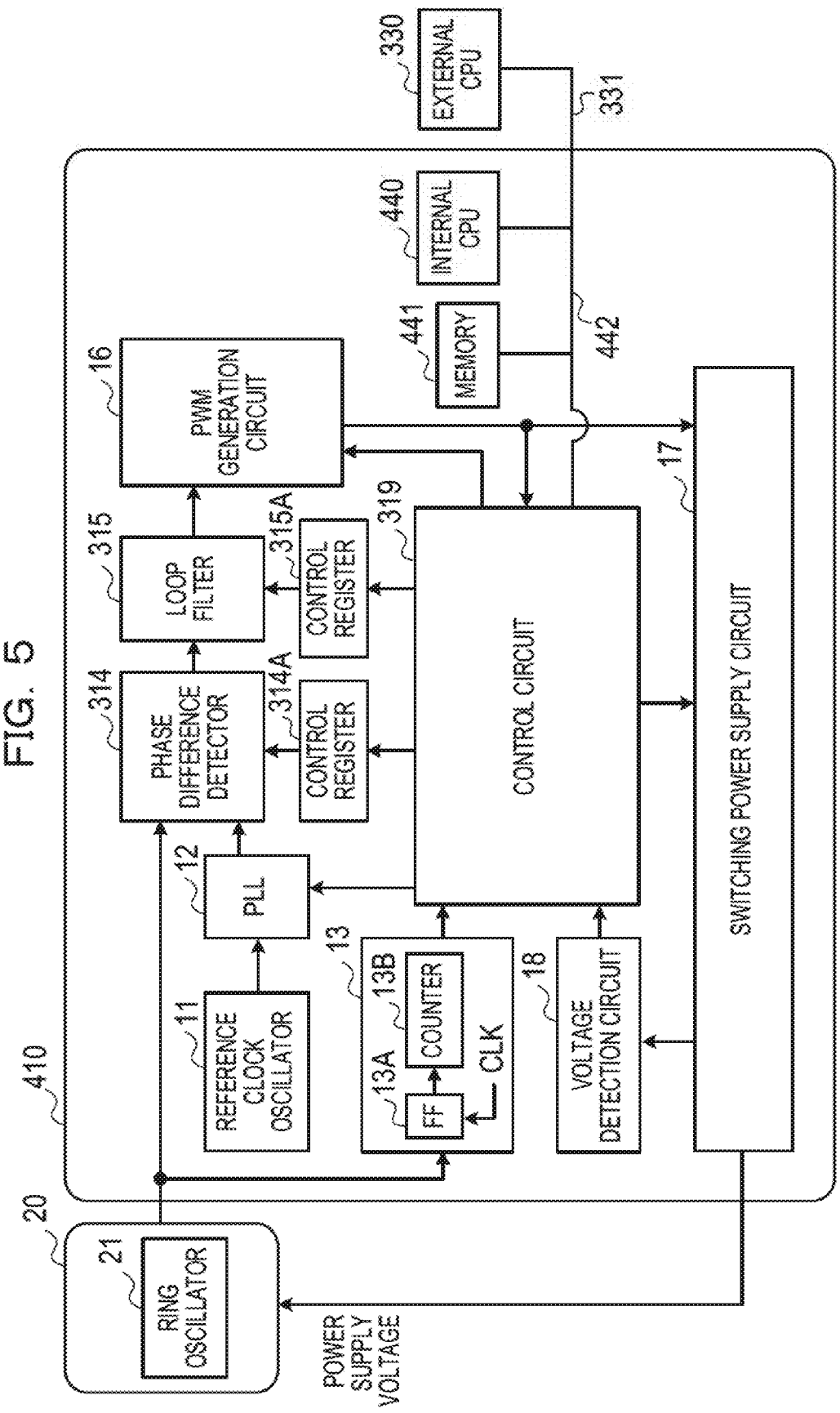
FIG. 5 is a diagram of a power supply voltage output circuit according to a fourth embodiment of the invention.

FIG. 5 is a diagram of a power supply voltage output circuit according to a fourth embodiment.

A power supply voltage output circuit 410 according to the fourth embodiment further includes an internal CPU 440 and an internal memory 441 in comparison to the third embodiment. The internal CPU 440 and the internal memory 441 are connected to a control circuit 319 through an internal bus 442.

The internal CPU 440 executes a process for storing a voltage value detected by a voltage detection circuit 18 in the internal memory 441.

The internal memory 441 stores the voltage value (digital voltage value) detected by the voltage detection circuit 18 and holds the voltage value even after the power supply voltage output circuit 410 has been deactivated. The internal memory 441 may be a non-volatile memory. The internal memory 441 may be regarded as storage unit of the invention.

The internal CPU 440 forces the internal memory 441 to hold the voltage value detected by the voltage detection circuit 18 before the power supply voltage output circuit 410 is deactivated. Moreover, when the power supply voltage output circuit 410 is reactivated after the power supply voltage output circuit 410 is deactivated, the internal CPU 440 forces the switching power supply circuit 17 to output the voltage value stored in the internal memory 441 before a phase difference detected by a phase difference detector 314 becomes substantially zero. Accordingly, the power supply voltage output circuit 410 may operate stably within a short period in comparison with an initial operation. This is because an oscillation frequency of the PLL 12 and an oscillation frequency of the ring oscillator 21 may be regarded as the same unless a control target 20 is changed by outputting the voltage value under the stable operation. On the other hand, the internal CPU 440 clears the voltage value stored in the internal memory 441 when the control target 20 has been changed.

According to the fourth embodiment, the power supply voltage output circuit 410 includes the internal CPU 440 and the internal memory 441. The internal memory 441 stores a voltage value of the previous operation of the power supply voltage output circuit 410, and the previous voltage value is read out when resuming an operation of the power supply voltage output circuit 410. This allows an activation of the power supply voltage output circuit 410 in a short period.

Examples of embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made therein without departing from the spirit and scope of the present invention as set forth in the claims.

The invention claimed is:

1. A power supply voltage output circuit comprising:
   a power supply voltage generation unit generating a power supply voltage to be supplied into a ring oscillator;
   a reference clock oscillator oscillating a reference clock with respect to a clock oscillated by the ring oscillator;
   a phase difference detection unit detecting a phase difference between the clock from the ring oscillator and the reference clock from the reference clock oscillator;
   a filter unit smoothing an output of the phase difference detection unit; and
   a Pulse Width Modulation (PWM) signal generation unit generating a PWM signal based on an output of the filter unit; and
   a control unit adjusting at least one of the output of the phase difference detection unit, the output of the filter unit, and an output of the PWM signal generation unit to an output so that a certain power supply voltage is output from the power supply voltage generation unit within a prescribed period of time after the ring oscillator is activated, the control unit being formed of a digital circuit.

2. The power supply voltage output circuit according to claim 1, wherein the control unit adjusts at least one of a cut-off frequency of the filter unit and a voltage threshold used for the generation of the PWM signal, and the control unit is formed of a digital circuit.

3. The power supply voltage output circuit according to claim 1, further comprising:
   a power supply voltage detection unit detecting the power supply voltage output from the power supply voltage generation unit; and
   a storage unit storing a voltage value detected by the power supply voltage detection unit,
   wherein the control unit adjusts at least one of the output of the phase difference detection unit, the output of the filter unit, and the output of the PWM signal generation unit to the output such that the voltage value stored in the storage unit is output from the power supply voltage generation unit as the certain power supply voltage when the ring oscillator is reactivated.

4. The power supply voltage output circuit according to claim 1, further comprising:

a power supply voltage detection unit detecting the power supply voltage output from the power supply voltage generation unit, wherein the control unit determines whether the voltage value detected by the power supply voltage detection unit is out of a certain range, and switches a drive mode of the power supply voltage generation unit to an abnormal mode when it is determined that the voltage value detected by the power supply voltage detection unit is out of the certain range, the control unit is formed of a digital circuit.

5. The power supply voltage output circuit according to claim 1, further comprising:

an operating state detection unit detecting an operating state of the ring oscillator based on the clock of the ring oscillator, wherein the control unit determines whether the operating state of the ring oscillator is abnormal based on an output from the operating state detection unit, and switches a drive mode of the power supply voltage generation unit to an abnormal mode when it is determined that the operating state of the ring oscillator is abnormal, the control unit is formed of a digital circuit.

* * * * *